(12) United States Patent
Zinn

(10) Patent No.: US 10,701,804 B2
(45) Date of Patent: Jun. 30, 2020

(54) COPPER NANOPARTICLE APPLICATION PROCESSES FOR LOW TEMPERATURE PRINTABLE, FLEXIBLE/CONFORMAL ELECTRONICS AND ANTENNAS

(71) Applicant: Kuprion Inc., San Jose, CA (US)

(72) Inventor: Alfred A. Zinn, Palo Alto, CA (US)

(73) Assignee: Kuprion Inc., San Jose, CA (US)

( * ) Notice: Subject to any disclaimer, the term of this patent is extended or adjusted under 35 U.S.C. 154(b) by 234 days.

(21) Appl. No.: 14/728,970

(22) Filed: Jun. 2, 2015

(65) Prior Publication Data

US 2015/0264807 A1    Sep. 17, 2015

Related U.S. Application Data

(62) Division of application No. 13/151,232, filed on Jun. 1, 2011, now Pat. No. 9,072,185.

(51) Int. Cl.
*H05K 1/09* (2006.01)
*C09D 11/322* (2014.01)
(Continued)

(52) U.S. Cl.
CPC .......... *H05K 1/097* (2013.01); *C09D 11/322* (2013.01); *C09D 11/52* (2013.01); *H05K 1/028* (2013.01); *H05K 3/1283* (2013.01); *H05K 3/14* (2013.01); *H01L 21/4867* (2013.01); *H01L 27/124* (2013.01); *H01L 27/1292* (2013.01); *H05K 3/02* (2013.01); *H05K 3/4069* (2013.01); *H05K 2203/0108* (2013.01); *H05K 2203/0126* (2013.01); *H05K 2203/0143* (2013.01);
(Continued)

(58) Field of Classification Search
CPC .......... C09D 11/322; C09D 5/32; C23C 4/11; B22F 1/0018; B82Y 30/00
USPC ............ 174/268; 55/524; 228/249; 361/728; 430/270.1
See application file for complete search history.

(56) References Cited

U.S. PATENT DOCUMENTS 3,332,916 A    7/1967  Hay
3,637,508 A    1/1972  Willsey et al.
(Continued)

FOREIGN PATENT DOCUMENTS

CN        1893023 A     1/2007
CN      101416304 A     4/2009
(Continued)

OTHER PUBLICATIONS

Basolo, et al.,"Steric Effects and the Stability of Complex Compounds. II. The Chelating Tendencies of N,N'-Dialkylethylenediamines with Copper (II) and Nickel (II) Ions", J. Am. Chem. Soc. (1954) vol. 76 (1), pp. 211-214.
(Continued)

*Primary Examiner* — Khanh T Nguyen
(74) *Attorney, Agent, or Firm* — Vorys, Sater, Seymour and Pease LLP

(57) ABSTRACT

An ink adapted for forming conductive elements is disclosed. The ink includes a plurality of nanoparticles and a carrier. The nanoparticles comprise copper and have a diameter of less than 20 nanometers. Each nanoparticle has at least a partial coating of a surfactant configured to separate adjacent nanoparticles. Methods of creating circuit elements from copper-containing nanoparticles by spraying, tracing, stamping, burnishing, or heating are disclosed.

17 Claims, 10 Drawing Sheets

(51) Int. Cl.
| | |
|---|---|
| *C09D 11/52* | (2014.01) |
| *H05K 3/12* | (2006.01) |
| *H05K 1/02* | (2006.01) |
| *H05K 3/14* | (2006.01) |
| *H05K 3/02* | (2006.01) |
| *H05K 3/40* | (2006.01) |
| *H01L 27/12* | (2006.01) |
| *H01L 21/48* | (2006.01) |

(52) U.S. Cl.
CPC ........... *H05K 2203/0278* (2013.01); *H05K 2203/107* (2013.01); *H05K 2203/1131* (2013.01)

(56) References Cited

U.S. PATENT DOCUMENTS

| | | |
|---|---|---|
| 4,931,323 A | 6/1990 | Manitt et al. |
| 5,147,841 A | 9/1992 | Wilcoxon |
| 5,159,171 A | 10/1992 | Cook et al. |
| 5,800,650 A | 9/1998 | Anderson et al. |
| 5,958,590 A | 9/1999 | Kang et al. |
| 6,143,356 A | 11/2000 | Jablonski |
| 6,348,295 B1 | 2/2002 | Griffith et al. |
| 6,358,627 B2 | 3/2002 | Benenati et al. |
| 6,645,444 B2 | 11/2003 | Goldstein |
| 6,730,400 B1 | 5/2004 | Komatsu et al. |
| 6,783,569 B2 | 8/2004 | Cheon et al. |
| 7,081,214 B2 | 7/2006 | Matsuba et al. |
| 7,118,843 B2 | 10/2006 | Teshima |
| 7,306,823 B2 | 12/2007 | Sager et al. |
| 7,419,887 B1 | 9/2008 | Quick et al. |
| 7,442,879 B2 | 10/2008 | Das et al. |
| 7,524,351 B2 | 4/2009 | Hua et al. |
| 7,535,715 B2 | 5/2009 | Chung |
| 7,559,970 B2 | 7/2009 | Kim et al. |
| 7,628,840 B2 | 12/2009 | Atsuki et al. |
| 7,637,982 B2 | 12/2009 | Hou et al. |
| 7,682,970 B2 | 3/2010 | Grigoropoulos et al. |
| 7,736,414 B1 | 6/2010 | Zinn |
| 7,743,964 B2 | 6/2010 | Maeda |
| 7,791,153 B2 | 9/2010 | Tsurume et al. |
| 7,847,397 B2 | 12/2010 | Wu et al. |
| 7,850,933 B2 | 12/2010 | Yang et al. |
| 7,858,025 B2 | 12/2010 | Shim et al. |
| 7,867,556 B2 | 1/2011 | Pickett |
| 8,105,414 B2 | 1/2012 | Zinn |
| 8,486,305 B2 | 7/2013 | Zinn et al. |
| 8,834,747 B2 | 9/2014 | Zinn |
| 9,011,570 B2 | 4/2015 | Bedworth et al. |
| 9,072,185 B2 * | 6/2015 | Zinn ............... C09D 11/322 |
| 2003/0100654 A1 | 5/2003 | Chheang et al. |
| 2003/0146019 A1 | 8/2003 | Hirai |
| 2004/0216517 A1 | 11/2004 | Xi et al. |
| 2004/0245648 A1 | 12/2004 | Nagasawa et al. |
| 2005/0058771 A1 | 3/2005 | Herron et al. |
| 2005/0249967 A1 | 11/2005 | Egli |
| 2006/0003156 A1 | 1/2006 | Masutani et al. |
| 2006/0062902 A1 | 3/2006 | Sager et al. |
| 2006/0068216 A1 | 3/2006 | Hua et al. |
| 2006/0121389 A1 * | 6/2006 | Anzures ............... C09D 5/32 430/270.1 |
| 2006/0189113 A1 | 8/2006 | Vanheusden et al. |
| 2006/0196579 A1 | 9/2006 | Skipor et al. |
| 2007/0006914 A1 | 1/2007 | Lee |
| 2007/0007033 A1 | 1/2007 | Das et al. |
| 2007/0131912 A1 | 6/2007 | Simone et al. |
| 2007/0202304 A1 | 8/2007 | Golovko et al. |
| 2007/0290175 A1 | 12/2007 | Kim |
| 2008/0003364 A1 | 1/2008 | Ginley et al. |
| 2008/0011125 A1 | 1/2008 | Shirata et al. |
| 2008/0032132 A1 | 2/2008 | Woodfield et al. |
| 2008/0072706 A1 | 3/2008 | Lee et al. |
| 2008/0124268 A1 | 5/2008 | Yang et al. |
| 2008/0149176 A1 | 6/2008 | Sager et al. |
| 2008/0151515 A1 | 6/2008 | Das et al. |
| 2008/0159902 A1 | 7/2008 | Shim et al. |
| 2008/0160183 A1 | 7/2008 | Ide et al. |
| 2008/0278181 A1 | 11/2008 | Zhong et al. |
| 2008/0286488 A1 | 11/2008 | Li et al. |
| 2008/0309722 A1 | 12/2008 | Silverbrook |
| 2009/0029148 A1 | 1/2009 | Hashimoto et al. |
| 2009/0145765 A1 | 6/2009 | Abys et al. |
| 2009/0148600 A1 | 6/2009 | Li et al. |
| 2009/0181183 A1 | 7/2009 | Li et al. |
| 2009/0214764 A1 | 8/2009 | Li et al. |
| 2009/0239073 A1 | 9/2009 | Huang et al. |
| 2009/0241496 A1 * | 10/2009 | Pintault ............... C23C 4/11 55/524 |
| 2009/0274833 A1 | 11/2009 | Li et al. |
| 2009/0274834 A1 | 11/2009 | Chopra et al. |
| 2009/0285976 A1 | 11/2009 | Lochtman et al. |
| 2009/0301606 A1 | 12/2009 | Ueshima |
| 2010/0000762 A1 | 1/2010 | Yang et al. |
| 2010/0031848 A1 | 2/2010 | Lee et al. |
| 2010/0065616 A1 * | 3/2010 | Zinn ............... B22F 1/0018 228/249 |
| 2010/0075137 A1 | 3/2010 | Sinton et al. |
| 2010/0139455 A1 | 6/2010 | Tilley et al. |
| 2010/0275729 A1 | 11/2010 | Jun et al. |
| 2010/0314578 A1 | 12/2010 | Purdy |
| 2010/0330686 A1 | 12/2010 | Park |
| 2012/0114521 A1 | 5/2012 | Zinn |
| 2012/0275119 A1 * | 11/2012 | Allen ............... B82Y 30/00 361/728 |
| 2012/0305306 A1 | 12/2012 | Zinn |
| 2014/0003991 A1 | 1/2014 | Zinn et al. |
| 2014/0134350 A1 | 5/2014 | Zinn |

FOREIGN PATENT DOCUMENTS

| | | |
|---|---|---|
| EP | 1921176 A2 | 5/2008 |
| EP | 2098316 A2 | 9/2009 |
| JP | 2002-154199 A | 5/2002 |
| JP | 2003-295479 A | 10/2003 |
| JP | 2008-166086 A | 7/2008 |
| JP | 2009006337 A | 1/2009 |
| JP | 2009-084677 A | 4/2009 |
| JP | 2010-174313 A | 8/2010 |
| JP | 2010-528428 A | 8/2010 |
| JP | 2012-521493 A | 9/2012 |
| KR | 20080010691 A | 1/2008 |
| WO | WO-2006/063134 A2 | 6/2006 |
| WO | WO-2006/076603 A2 | 7/2006 |
| WO | WO 2008/018718 | 2/2008 |
| WO | WO-2009/115643 A2 | 9/2009 |
| WO | WO-2010/030487 A1 | 3/2010 |
| WO | WO-2010/036114 A2 | 4/2010 |
| WO | WO-2011/065997 A1 | 6/2011 |

OTHER PUBLICATIONS

Huaman, et al., "Copper Nanoparticles synthesized by hydroxyl ion assisted alcohol reduction for conducting ink," Journal of Materials Chemistry, 2011, vol. 21, pp. 7062-7069.

Jang, et al., "Sintering of Inkjet Printed Copper Nanoparticles for Flexible Electronics," Scripta Materialia, 2010, vol. 62, pp. 258-261.

Kang, et al., "Inkjet Printed Electronics Using Copper Nanoparticle Ink", J Mater Sci: Mater Electron (2010) vol. 21 pp. 1213-1220.

Kanninen, et al., "Influence of Ligand Structure on the Stability and Oxidation of Copper Nanoparticles", Journal of Colloid and Interface Science 318 (2008) pp. 88-95.

Lisiecki, et al., "Control of the Shape and the Size of Copper Metallic Particles", J. Phys. Chem 1996, 100, pp. 4160-4166.

Magdassi, et al., "Copper Nanoparticles for Printed Electronics: Routes Towards Achieving Oxidation Stability", Materials (2010) vol. 3, pp. 4626-4638.

Mott, et al., "Synthesis of Size-Controlled and Shaped Copper Nanoparticles", Langmuir 2007, 23, pp. 5740-5745.

Product Description—"Copper Nano Powder" TradeKey 2011.

(56) References Cited

OTHER PUBLICATIONS

Product Description—"Copper Nanoparticle and Cupric Salt Product Specialized Team", Suzhou Cantuo Nano Technology Co. Ltd. 2010.
Product Description—"Copper Nanoparticle, Cu", NaBond Technologies Co., Ltd. 2001-2009.
Product Description—"Copper Nanoparticles", American Elements 2001-2010.
Product Description—"Nano-Copper", Sun Innovations, Inc. 2005-2010.
Product Description—"Nanopowders" Sigma-Aldrich 2010.
Product Description—"Powders: Nanoparticles & Nanopowders", SkySpring Nanomaterials, Inc.
Product Description—Copper Nanoparticle (Copper Nanopowder), Suzhou Canfuo Nano Technology Co., Ltd. 1997-2011.
Product Description—Metal & Alloy Nanoparticles, Nanoshel 2007-2009.
Pulkkinen, et al., "Poly(ethylene imine) and Tetraethylenepentamine as Protecting Agents for Metallic Copper Nanoparticles", Applied Materials & Interface, (2009) vol. 1, No. 2, pp. 519-525.
Wang, et al., "Poly(allylamine)-Stabilized Colloidal Copper Nanoparticles: Synthesis, Morphology, and Their Surface-Enhanced Raman Scattering Properties", Langmuir Article (2010) vol. 26 (10), pp. 7469-7474.
Wu, et al., "One-Step Green Route to Narrowly Dispersed Copper Nanocrystals", Journal of Nanoparticle Research (2006) pp. 965-969.
Wu, et al., "Simple One-Step Synthesis of Uniform Disperse Copper Nanoparticles", Mater. Res. Soc. Symp. Proc. vol. 879E, 2005 Materials Research Society, pp. Z6.3.1-Z6.3.6.
Wu, et al., "Synthesis of high-concentration Cu nanoparticles in aqueous CTAB solutions," J. Colloid and Interface Science 2004, 273, pp. 165-169.
Yeshchenko, et al., "Size-Dependent Melting of Spherical Copper Nanoparticles Embedded in a Silica Matrix", Physical Review B 75 (2007), pp. 085434-1 to 085434-6.
Aslam, et al., "Formation of Cu and Cu2O Nanoparticles by Variation of the Surface Ligand: Preparation, Structure and Insulating-to-Metallic Transition," Journal of Colloid and Interface Science, 2002, pp. 79-90.
Chu, et al., "Thermal Aqueous Solutin Approach for the Synthesis of Triangular and Hexagonal Gold Nanoplates with Three Different Size Ranges," Inorg Chem, 2006, vol. 45, pp. 808-813.
Foresti, et al., "New Thiophene Monolayer Protected Copper Nanoparticles: Synthesis and Chemical-Physical Characterization," Alma Mater Studiorum Bologna University, Bologna, Italy, 2008.
Gupta, "Synthesis of Metallic Nanoparticles and Their Applications," Master Thesis, Department of Research and Advanced Studies, University of Cincinnati, 2006.
Jiang, et al., "Size-dependent melting properties of tin nanoparticles," Chemical Physics Letters, 2006, vol. 429, pp. 492-496.
Kogiso, et al., "One-dimensional organization of copper nanoparticles by chemical reduction of lipid-copper hybrid nanofibers," Chem Comm, 2002, pp. 2492-2493.
Masala, et al., "Synthesis Routes for Large Columes of Nanoparticles," Annu Rev Mater Res, 2004, vol. 34, pp. 41-81.
Mirjalili, et al., "Predictino of nanoparticles' size-dependent melting temperature using mean coordination number concept," Journal of Physics and Chemistry of Solids, 2008, vol. 69, pp. 2116-2123.
Murai, et al., "Preparation of copper nanoparticles with an organic coating by a pulsed wire discharge method," Journal of Ceramic Processing Research, 2007, vol. 8, No. 2, pp. 114-118.
Shandiz, et al., "Effective coordination number model for the size dependency of physical properties of nanocrystals," Journal of Physics: Condensed Matter, 2008, vol. 20, 9 pages.
Yonezawa, et al., "The preparation of copper fine particle paste and its application as the inner electrode material of a multilayered ceramic capacitor," Nanotechnology, 2008, vol. 19, 5 pages.
Lin, et al., "The influence of nano-particles on microstructural development at the interface of Sn3.5Ag-solder and Cu-substrate," Int J Nanomanufacturing, 2007, vol. 1, No. 3, pp. 357-369.

* cited by examiner

COPPER NANOPARTICLE APPLICATION PROCESSES FOR LOW TEMPERATURE PRINTABLE, FLEXIBLE/CONFORMAL ELECTRONICS AND ANTENNAS

CROSS-REFERENCES TO RELATED APPLICATIONS

The present application is a divisional of U.S. application Ser. No. 13/151,232, filed Jun. 1, 2011, entitled "COPPER NANOPARTICLE APPLICATION PROCESSES FOR LOW TEMPERATURE PRINTABLE, FLEXIBLE/CONFORMAL ELECTRONICS AND ANTENNAS," which is incorporated by reference in its entirety. U.S. application Ser. No. 13/151,232 is related to U.S. application Ser. No. 12/512,315, filed Jul. 30, 2009, entitled "LEAD SOLDER-FREE ELECTRONICS," and now U.S. Pat. No. 8,105,414, which issued Jan. 31, 2012.

STATEMENT REGARDING FEDERALLY SPONSORED RESEARCH OR DEVELOPMENT

Not Applicable.

BACKGROUND

Field

The present invention relates to printed electronics and, in particular, the creation of circuit elements using copper nanoparticles.

Description of the Related Art

Electrical assemblies are currently fabricated using a rigid substrate with individual components attached to the substrate and interconnected with conductive paths or "traces" on the substrate. The traces are typically created on the surface of the substrate by coating the entire surface of the substrate with a layer of copper, masking the copper with the interconnect pattern using a photolithographic process, and selectively etching away the non-masked copper. The minimum separation of the traces is often limited by the etching process. More complicated circuits are fabricated using multiple layers of circuit traces separated by insulating layers with connections between the conductive layers formed by holes between the insulating layers that are filled with conductive material. These interlayer connections are called "vias." A rigid substrate with one or more layers of circuit traces is referred to as a printed circuit board (PCB) and an electronic assembly that is formed by mounting electronic components to the PCB is a printed circuit board assembly (PCBA).

The drive to fit electronics into smaller or curved packages drove the development of flexible substrates where the traces are created by plating and etching as done with the rigid substrates or screen printing a conductive material onto the flexible substrate. These flexible printed circuits (FPCs) are limited in the separation of circuit elements, referred to as the "pitch" of the traces, in the same way as convention rigid PCB fabrication as they use the same processes to form the circuits.

The ability to directly print circuit elements has been developed in the last decade or so to take advantage of low-cost printing technologies. Common printing processes such as screen printing, gravure, offset lithography, and inkjet have been used to create circuits using both conductive carbon-based compounds and metals. Each of the processes have advantages and disadvantages related to resolution, throughput, and cost. Circuits fabricated from carbon-based compounds have a lower conductivity than metal circuits. The metal inks require temperatures of up to 300° C. to fuse the metal particles into a continuous conductive strip, limiting the substrate to materials that are stable at this temperature.

It would be beneficial to be able to produce highly conductive circuits and circuit elements on both rigid and flexible substrates with a finer pitch than possible with current printing technologies and/or without requiring elevated process temperatures.

SUMMARY

The present invention includes the printing of electronic circuits and elements using copper nanoparticles, which enables the creation of copper circuits and elements onto a variety of rigid and flexible substrates at pitches below 100 micrometers. When nanoparticles having a diameter of under 20 nanometers, preferably under 10 nanometers, more preferably in the range of 1-7 nanometers, and even more preferably in the range of 3-5 nanometers, are printed onto a substrate in a manner similar to that of inkjet printers, the nanoparticles fuse upon impact with the substrate. Copper nanoparticles of these sizes can also be applied in a pattern and fused by exposure to a short-duration pulse of radiant energy, such as a laser or a bright light, or by exposure to a temperature of less than 200° C., and preferably less than 70° C. Copper nanoparticles of these sizes can also be fused by pressure such as compression under a form or by tracing the desired pattern with a mechanical stylus such as a nanoinscriber. Forming circuit elements in the methods described herein allows the use of substrate materials, and particularly flexible materials, that cannot tolerate the chemicals and temperatures of the current processes used to create circuit elements on substrates for electronic assemblies. The methods of printing and forming circuit elements from copper nanoparticles as described herein also enable finer pitch circuits, i.e. having small separation distances between conductive elements, than possible with other processes. Circuit elements formed from copper nanoparticles may include passive devices such as resistors, capacitors, and inductors, active devices such as transistors, Radio Frequency (RF) elements such as antennae, reflectors, and waveguides, other circuit elements such as ground and power planes, shielding, and signal paths, and even complete devices such as a Radio Frequency IDentification (RFID) tag.

In certain embodiments, a circuit element is disclosed that comprises a first layer of formed metal comprising fused nanoparticles that comprise copper and had a diameter of less than 20 nanometers prior to being fused.

In certain embodiments, a circuit assembly is disclosed that comprises a substrate and a first layer of formed metal coupled to the substrate, the first layer of formed metal comprising fused nanoparticles that comprise copper and had a diameter of less than 20 nanometers prior to being fused.

In certain embodiments, a circuit-printing device is disclosed that comprises a sprayer configured to emit a plurality of drops of a mixture comprising nanoparticles that comprise copper and have a diameter of less than 20 nanometers toward a substrate with sufficient velocity that the nanoparticles fuse with each other upon impact with the substrate and form a plurality of dots on the substrate, wherein each dot comprises a layer of fused nanoparticles and overlapping dots are fused to each other.

In certain embodiments, a method of creating a conductive element on a substrate is disclosed. The method comprising the step of spraying a plurality of drops of a mixture comprising nanoparticles that comprise copper and have a diameter of less than 20 nanometers toward a substrate with sufficient velocity that the nanoparticles fuse with each other upon impact with the substrate and form a plurality of dots on the substrate, wherein each dot comprises a layer of fused nanoparticles and overlapping dots are fused to each other.

In certain embodiments, a method of creating a conductive element on a substrate is disclosed. The method comprising the steps of applying a layer of a mixture comprising nanoparticles that comprise copper and have a diameter of less than 20 nanometers over at least a portion of a surface of a substrate, and fusing the nanoparticles together in at least a portion of the mixture layer.

BRIEF DESCRIPTION OF THE DRAWINGS

FIGS. 15A-15B depict another method of printing a circuit element according to certain aspects of the present disclosure.

DETAILED DESCRIPTION

Some inkjet printers use a piezoelectric actuator to eject a drop of ink from an ink-filled chamber or channel beneath each nozzle. When a voltage is applied, the piezoelectric material changes shape, creating a pressure wave in the channel that ejects a droplet of ink from the nozzle with sufficient velocity to reach the paper on which the image is being created. Piezoelectric inkjet technology allows the use of a wider variety of inks than thermal inkjet technology as there is no requirement for a volatile component, and no issue with kogation of the ink. One printing process is referred to as "drop-on-demand", wherein software directs the printheads to eject one or more droplets of ink from a nozzle only when it is desired to create an image on the portion of the paper immediately in front of the nozzle.

Copper particles having diameters of less than 20 nanometers have properties that are not linear extensions of their bulk properties. At these diameters, copper nanoparticles are considered to be "meta-stable" and require very little energy to mobilize the atoms to fuse when nanoparticles are in direct contact. The energy required decreases nonlinearly as diameters of the nanoparticle decreases, and reaches a level in the range generally below 10 nanometers where nanoparticles fuse upon direct metal-to-metal contact. Copper nanoparticles must be coated with a surfactant to prevent the nanoparticles from fusing when dispersed in a liquid. A mixture of the surfactant-coated nanoparticles with a carrier liquid can be treated in much the same way that an ink is treated, except the copper-containing mixture requires certain additional conditions to fuse the copper nanoparticles at the desired time. Copper nanoparticles of less than 20 nanometers appear to have a color ranging from red to black, depending on the degree of agglomeration and aggregation, facilitating the absorption of radiant energy. One of the advantages of creating circuit elements or other conductive structures is that the energy required to fuse the copper nanoparticles is so low that the substrate temperature does not increase above 70° C. and, in certain embodiments, is barely heated at all. This compares to current processes of fusing gold and silver nanoparticles in ovens at temperatures above 70° C. and up to 300° C. for periods of time that may be as long as 30 minutes.

Figure 1:
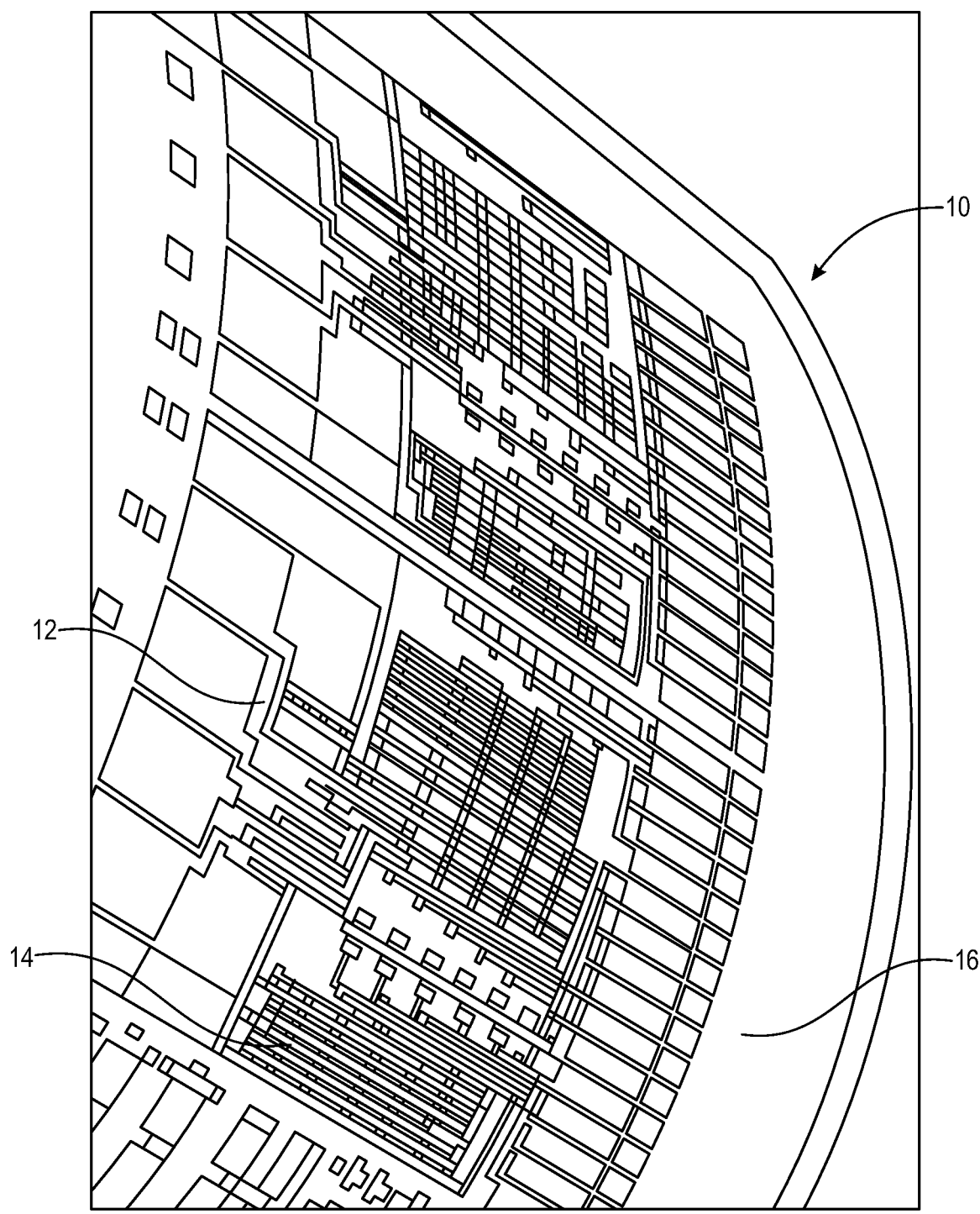
FIG. 1 is an illustrative example of a printed circuit assembly (PCA) having a flexible substrate onto which electrical components and circuits may be printed according to certain aspects of the present disclosure.

FIG. 1 is an illustrative example of a PCA 10 having a flexible substrate 16 onto which electrical components 14 and circuits 12 may be printed according to certain aspects of the present disclosure. Simple electrical circuits have been previously created on flexible substrates such as polyimide that are able to withstand the chemicals used to plate and etch the circuits and survive exposure to temperatures over 200° C. One advantage of flexible PCAs is that electronics built on the flexible PCAs may be packaged into small and irregularly shaped spaces. A flexible substrate also allows a PCA to conform to a curved support structure such that heat can be more effectively transferred to the structure. The difficulty in getting the heat out of electronics built on rigid printed circuit boards (PCBs) limits the functionality of the electronics. Printing the circuits 12 and components 14 onto a substrate 16 using a process that does not require high temperature expose opens up a variety of substrate materials that are otherwise excluded by the low-temperature limitation of the material.

Figure 2:
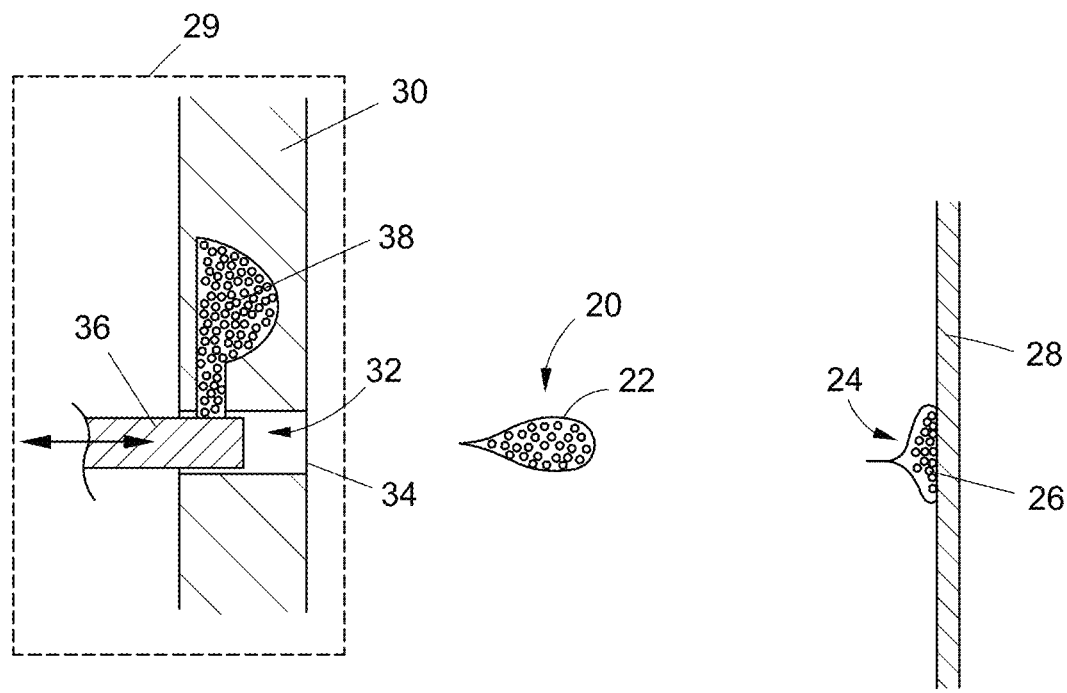
FIG. 2 depicts an exemplary method of printing a circuit element according to certain aspects of the present disclosure.

FIG. 2 depicts an exemplary method of printing a circuit element according to certain aspects of the present disclosure. An inkjet printer 29, or similar printing device, includes a printhead 30 that has a nozzle 32 connected to an ink manifold 38. In this embodiment, a piezoelectric driving element 36 intrudes into the nozzle 32 such that in the non-energized configuration, the driving element 36 retracts to the left, in the orientation of FIG. 2, and connects the ink manifold 38 to the nozzle 32. Ink flows from the ink manifold 38 into the nozzle 32 and partially fills the nozzle 32. When it is desired to eject a drop of ink, a voltage is applied to the piezoelectric driving element 36 which expands toward the right, in the orientation of FIG. 2. This expansion into the nozzle 32 ejects a drop 20.

In the embodiment of FIG. 2, the "ink" is a mixture that includes a plurality of nanoparticles 22 that comprise copper. In certain embodiments, the size of these nanoparticles 22 is less than 20 nanometers, preferably less than 10 nanometers, more preferably between 1-7 nanometers, and even more preferably between 3-5 nanometers. Although the nanoparticles 22 are not necessarily true spheres, the nanoparticles 22 are considered to have a "size" or "diameter" that is an average of multiple surface-to-surface distances, measured through the center of mass of the nanoparticle 22, over a variety of positions about the nanoparticle 22. Nanoparticles 22 that are not near-spherical still exhibit some of the properties described herein but the behavior of the particles is not as uniform and consistent as it is for near-spherical nanoparticles. In certain embodiments, the mixture includes a liquid in which the nanoparticles 22 are dispersed. In certain embodiments, the liquid may comprise one or more of water, alcohol, solvents, or other carrier materials and may further comprise surfactants, dispersants, stabilizers, or other chemicals that are applied to the surface of the nanoparticles 22 or dissolved in the solvent to maintain particle separation and avoid clumping or adhesion of the nanoparticles 22 in the mixture or modify the viscosity, surface tension, or other attribute of the mixture. In certain embodiments, the nanoparticles 22 comprise at least a partial coating of a surfactant (not visible in FIG. 2).

One of the attributes of copper nanoparticles 22 that are 20 nanometers or less in size, preferably less than 10 nanometers, more preferably between 1-7 nanometers, and even more preferably between 3-5 nanometers, is that the nanoparticles 22 will fuse upon metal-to-metal contact with each other. One way to keep that nanoparticles 22 from fusing in the mixture prior to printing is to coat each nanoparticle 22 with a layer of a surfactant or other material that tends to space apart or repulse other nanoparticles 22 that are coated with the same material.

When a drop 20 of the mixture is ejected from the nozzle 32 of the printer 29, it travels the open space between the printer 29 and the substrate 28 and strikes the substrate 28 with a velocity that may exceed 10 meters per second (22 miles per hour). When the drop 20 strikes the substrate 28, the nanoparticles 22 tend to move through the liquid in the former direction of the drop 20. As the first nanoparticles 22 stop upon contact with the substrate 28, additional nanoparticles 22 will continue to move through the liquid and strike the stationary nanoparticles 22 with sufficient energy to displace the coating of surfactant of the two nanoparticles 22 and allow metal-to-metal contact between the nanoparticles 22. Collision-induced reactions at the molecular level have been dubbed "chemistry with a hammer." The nanoparticles 22 must have enough energy to push aside the surfactants on the surface of the colliding nanoparticles 22 such that the metal cores of the two nanoparticles 22 make contact. This metal-to-metal contact allows the reactive surface atoms to start flowing, thus causing fusion bonding between the nanoparticles 22 into larger crystals and solid layers. As more nanoparticles 22 of the drop 20 of the mixture strike the growing fused mass of nanoparticles 22, a layer of metal 26 is formed as a dot on the substrate 28. This layer will tend to adhere to the substrate by simple mechanical adhesion, as most surfaces are irregular at the nanoscale and the fused layer of metal will be interlocked with the irregular surface features of the substrate 28. FIG. 2 shows a cross-section of substrate 28 wherein a drop 24 has struck the substrate 28 and the nanoparticles 22 have collided to form a dot of metal 26 on the surface of the substrate 28.

The interparticle pressure required to fuse nanoparticles 22 of about 25 nanometers and smaller is in the range of approximately 600-13,800 kilopascals (kPa) (roughly 90 to 2000 pounds per square inch (psi)), depending on the size of the nanoparticles 22 and the surfactants that are included in the mixture. Larger particles tend to be increasing hard to fuse, requiring higher pressures or pressure in conjunction with heat.

In certain embodiments, the liquid in the mixture may be formulated such that the liquid in each drop 20 at least partially evaporates during the flight from the printer nozzle 32 to the substrate 28. In certain embodiments, all of the liquid in each drop 20 evaporates leaving only individual nanoparticles 22 to individually strike the substrate and fuse.

Figures 3A, 3B:
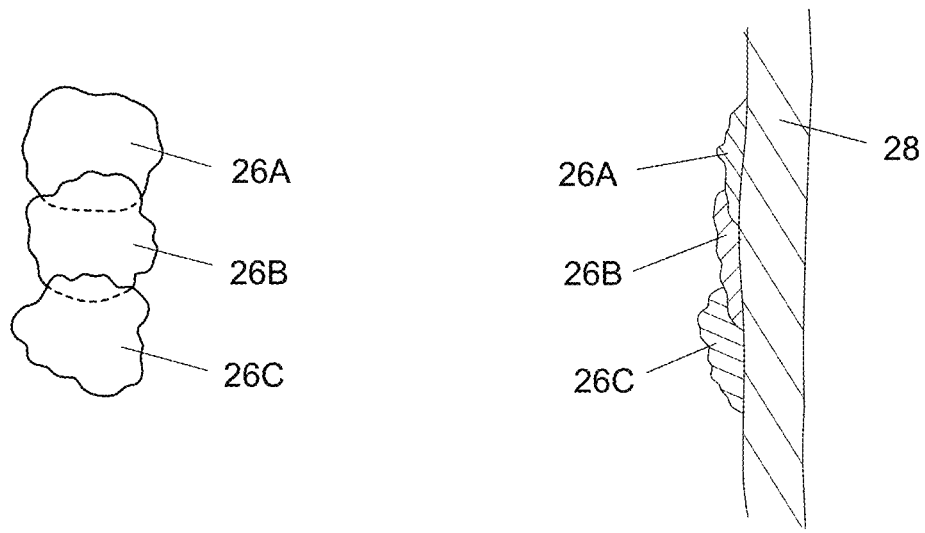
FIGS. 3A and 3B depict a portion of a PCA created by printing according to certain aspects of the present disclosure.

FIGS. 3A and 3B depict a portion of a PCA created by printing according to certain aspects of the present disclosure. FIG. 3A shows three dots 26A, 26B, 26C created by the printing process shown in FIG. 2. Each dot 26, in this embodiment, is an irregular circle of metal that remains after the carrier liquid of the mixture has evaporated. In other embodiments, these dots 26 will have an elongated shape caused by the lateral velocity of the substrate 28 passing or under the printer nozzle 32. In the embodiment of FIG. 3A, the substrate 28 has shifted relative to the nozzle 32 between the ejection of sequential drops 20 of mixture such that the dots 26A, 26B, 26C formed by the drops 20 of the mixture are offset in an overlapping pattern.

FIG. 3B is a cross-section side view of the dots 26 and substrate 28 of FIG. 3A. It can be seen that the layers of metal 26 that form the dots are overlapping the adjacent layers of metal 26. Some of the first nanoparticles 22 of the drop of mixture that formed dot 26B that reached the substrate 28 struck the metal layer of the previous dot 26A, whereupon the nanoparticles of dot 26B fused with the layer of metal of dot 26A such that the layers of metal of dots 26A and 26B are electrically connected. Similarly, the metal layer of dot 26C is fused with the metal layer of dot 26B and therefore electrically connected to the metal layers of both dots 26B and 26C. In this manner, an electrical pathway or circuit is formed by continuously overlapping dots 26 between the two points that are to be electrically connected. This electrical circuit can be wider than a single row of dots and follow any pattern, limited only by the patterning capabilities of the printer. The printing of electrical circuit and elements can be controlled in a manner similar to that used to print with ink on paper, wherein any shaped or patterned metal layer can be formed in the same manner that an image can be printed on a standard printer.

The printing method of FIGS. 2 and 3A-3B can be used to create multilayer PCAs. The first layer of circuitry is formed by printing on the bare substrate, forming a layer of formed metal. A layer of a nonconductive material is then applied over a portion of the first layer of formed metal. In certain embodiments, this nonconductive layer is applied by a similar printing process using a nonconductive mixture that hardens or cures after application. A second layer of formed metal is then created by printing over the first layer of formed metal and the layer of nonconductive material. Where the second layer of formed metal overlaps exposed areas of the first layer of formed metal, an electrical connection between the layers is formed. This is discussed in greater detail with respect to FIG. 6B.

Figure 4:
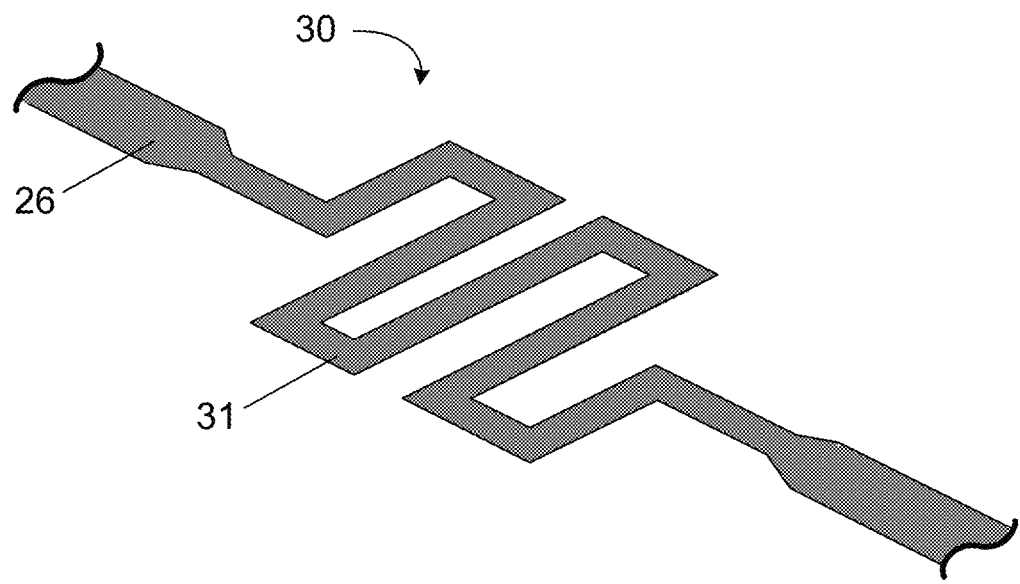
FIG. 4 depicts a resistor formed by printing and fusing copper nanoparticles according to certain aspects of the present disclosure.

FIG. 4 depicts a resistor 30 formed by printing and fusing copper nanoparticles 22 according to certain aspects of the present disclosure. The resistor 30 is formed in a single layer of metal 26. The resistance is created by forming a long, thin path 31 of conductive metal that, in the embodiment of FIG. 4, follows a serpentine path to create the maximum length of path 31 in a minimum area.

Figure 5:
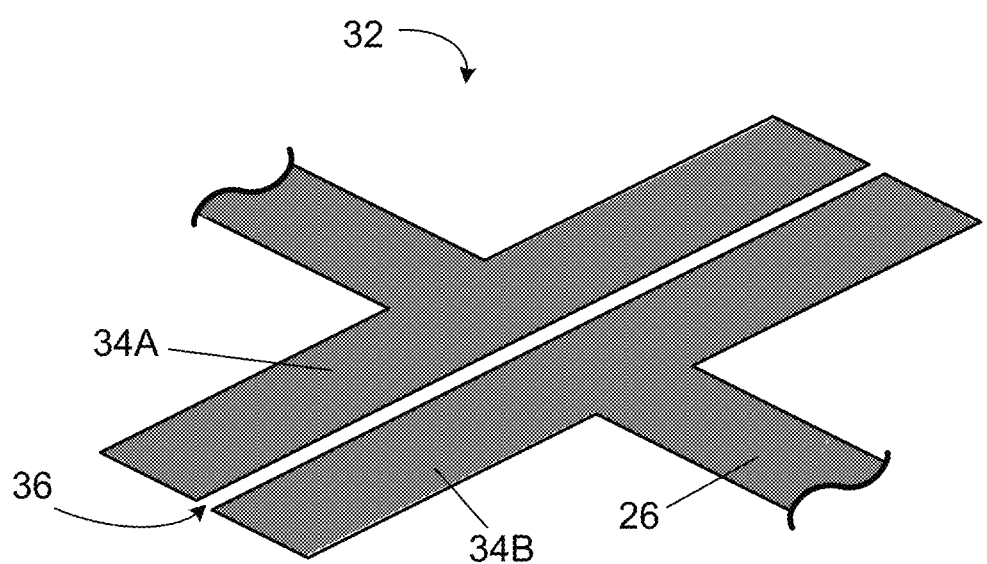
FIG. 5 depicts a capacitor formed by printing and fusing copper nanoparticles according to certain aspects of the present disclosure.

FIG. 5 depicts a capacitor 32 formed by printing and fusing copper nanoparticles 22 according to certain aspects of the present disclosure. This embodiment of a capacitor 32 is formed in a single layer of metal 26. Two electrodes 34A and 34B are created with a narrow space 36 separating the electrodes 34A, 34B. In certain embodiments, the electrodes 34A, 34B are created in separate layers with one electrode above the other.

Figure 6A:
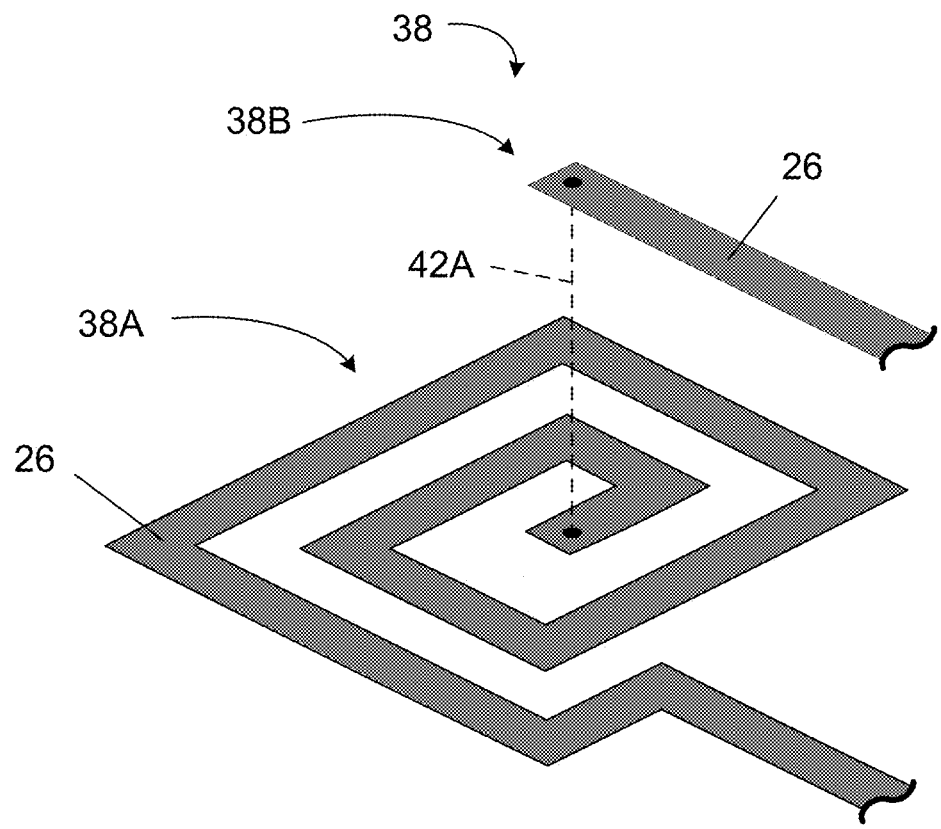
FIGS. 6A and 6B depict an inductor formed by printing and fusing copper nanoparticles according to certain aspects of the present disclosure.
Figure 6B:
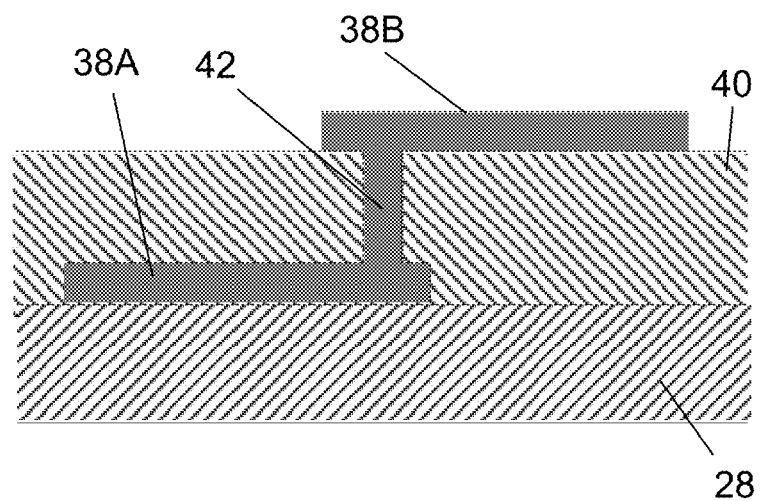

FIGS. 6A and 6B depict an inductor 38 formed by printing and fusing copper nanoparticles 22 according to certain aspects of the present disclosure. FIG. 6A is a perspective view of the conductive portions of the inductor 38 and FIG. 6B is a cross-section of the inductor 38 taken across a portion of the inductor 38 passing through the center of the inductor 38. In the embodiment of FIGS. 6A and 6B, a first layer of metal 26 forms a spiral 38A. A layer 40 of nonconductive material (not shown in FIG. 6A) is formed over the spiral 38A. A second layer of metal 26 is formed as a strip 38B above nonconductive layer 40, with the end of strip 38B over the center of spiral 38A. A via 42 (shown as line of connection 42A in FIG. 6A) is formed through the nonconductive layer 40 and electrically connects strip 38B to spiral 38A. In certain embodiments, the via 42 is formed by creating a hole through layer 40 to spiral 38A using a process such as laser drilling prior to forming the strip 38B such that metal 26 fills the hole to create via 42 at the same time as the strip 38B is formed. In certain embodiments, a hole is created after strip 38B is formed, the hole passing through strip 38B and layer 40 to spiral 38A, and the hole is filled with metal 26 in a subsequent operation. In certain embodiments, the printer 29 adjusts the printing operation to deposit extra drops of mixture over the hole in which the via 42 is to be formed so as to provide sufficient nanoparticles 22 to fill the via 42. In certain embodiments, the via 42 can be sized and the mixture of nanoparticles 22 formulated to take advantage of surface tension to enhance distribution and spreading of the mixture within the hole.

It will be apparent that these same techniques can be used to create three-dimensional structures for other functions such as providing thermally conductive paths for thermal management, for example conducting heat from an active electrical component to a heat sink.

Figure 7A:
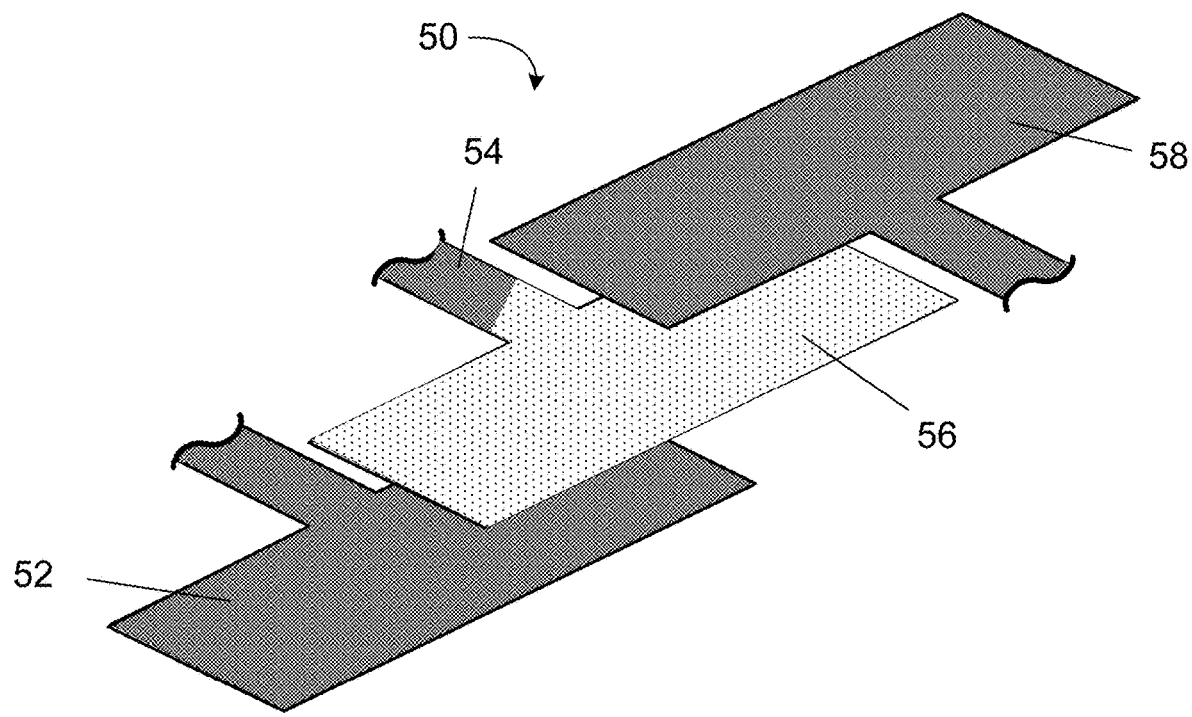
FIGS. 7A and 7B depict an active device formed by printing and fusing copper nanoparticles according to certain aspects of the present disclosure.
Figure 7B:
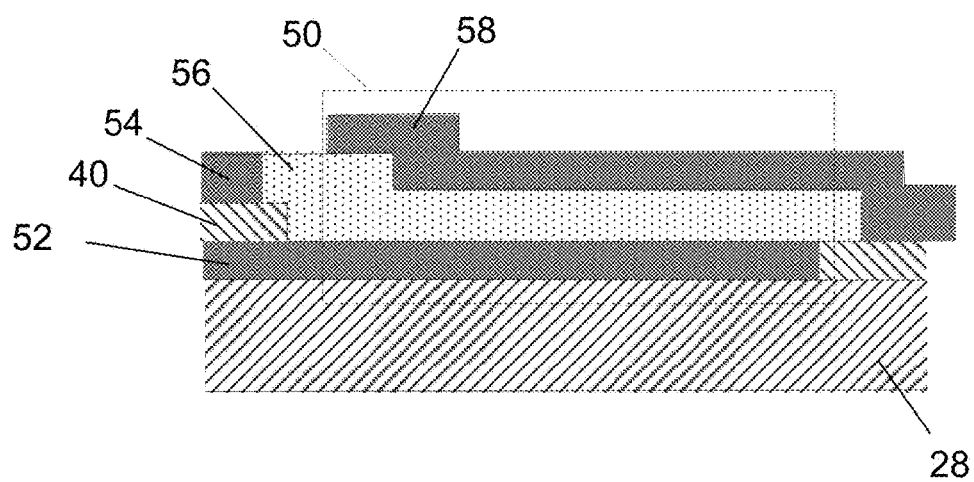

FIGS. 7A and 7B depict an active device 50 formed by printing and fusing copper nanoparticles 22 according to certain aspects of the present disclosure. In this embodiment, a first electrode 52 is printed as a rectangle onto a substrate 28 (not shown in FIG. 7A). In other embodiments, the first electrode 52 has other shapes including a circle. A layer of non-conducting material 40 is formed over a portion of first electrode 52. In this embodiment, a layer of a semiconductor 56 is applied over a portion of the first electrode 52. This semiconductor is selected based on the desired function of the active device 50. In certain embodiments, the semiconductor 56 is adapted for electron transport. In certain embodiments, the semiconductor 56 is adapted for photon emission. In certain embodiments, the semiconductor 56 is an organic material. In this embodiment, a conductor 54 is formed over the nonconductive material 40 and connected to the semiconductor 56. In this embodiment, a second electrode 58 is formed over a portion of the semiconductor 56. The first electrode 52, conductor 54, and second electrode 58 are connected to other circuit elements that manipulate the active device 50. It will be apparent to those of ordinary skill in the art that many types of active devices can be constructed using conductive layers formed from copper nanoparticles 22 as described herein.

Figure 8:
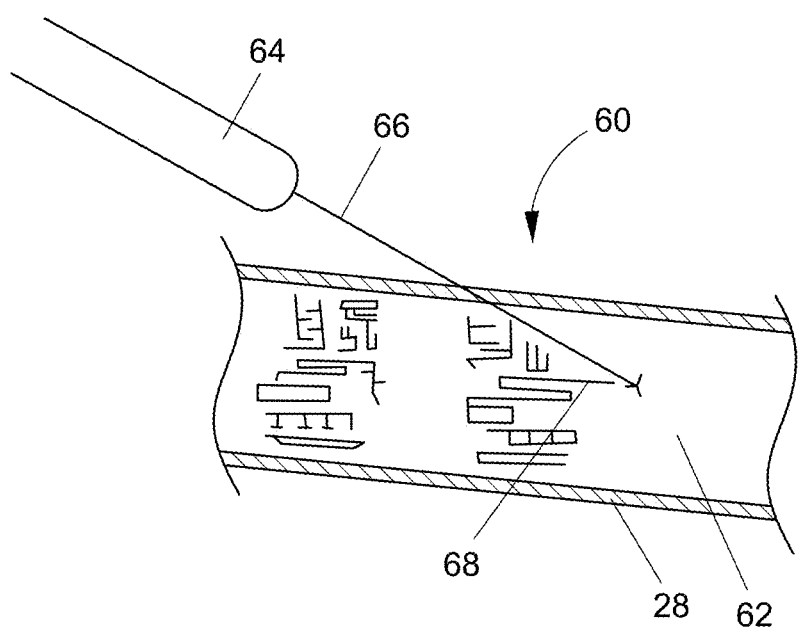
FIG. 8 depicts a method of fusing nanoparticles using a laser according to certain aspects of the present disclosure.

FIG. 8 depicts a method of fusing nanoparticles using a laser 64 according to certain aspects of the present disclosure. In this embodiment, a layer of a mixture 62 containing copper nanoparticles 22 having a diameter of less than 20 nanometers, and preferably less than 10 nanometers, and more preferably less than 4 nanometers, is spread evenly across a strip of substrate 28. When copper nanoparticles 22 have a diameter of less than 20 nanometers, the nanoparticles 22 require very little energy to fuse. In this embodiment, a laser 64 creates a beam of optical radiation 66 and directs this beam to the portions of the layer 62 where it is desired to form a pattern 68 of fused nanoparticles. In certain embodiments, the optical radiation 66 has a defined frequency band. In certain embodiments, the frequency band of the optical radiation 66 covers at least a portion of the adsorption band of the nanoparticles 22. The energy of the optical radiation 66 is tuned to provide just enough energy to fuse the nanoparticles 22 in the layer of the mixture 62. In certain embodiments, the energy required to fuse the nanoparticles 22 raises the temperature of the substrate by less than 20° C. After the pattern 68 of fused metal is completed, the unfused mixture 62 is removed, leaving a strip 60 of circuit elements.

Figure 9A:
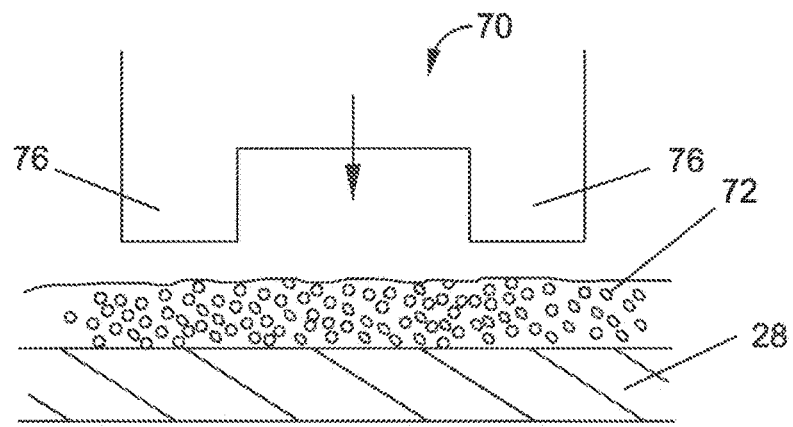
FIGS. 9A-9D depicts a method of fusing nanoparticles by compressing the nanoparticles using a form according to certain aspects of the present disclosure.

FIGS. 9A-9D depicts a method of fusing nanoparticles 22 by compressing, or stamping, the nanoparticles 22 using a form 70 according to certain aspects of the present disclosure. FIG. 9A depicts a layer of mixture 72 formed on a substrate 28. A form 70 has a pattern of raised portions 76 in the shape of the circuit element to be created. This form is pressed downward under force until it contacts the layer of mixture 72.

Figure 9B:
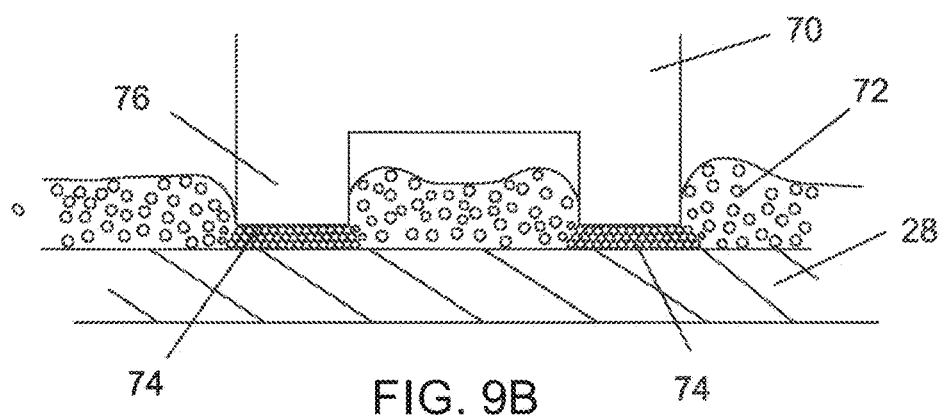

FIG. 9B depicts the process after the form 70 has developed pressure against layer of mixture 72 and the substrate 28. The nanoparticles 22 under the raised portions 76 have been compressed until the nanoparticles 22 are in direct contact with each other. Nanoparticles 22 having a diameter in the range of 20 nanometers, preferably less than 10 nanometers, more preferably in the range 1-7 nanometers, and even more preferably in the range 3-5 nanometers, have been shown to fuse under relatively low pressures and without inducing an increase in the temperature of the substrate 28. A pressure of 90-2000 psi is required, depending on the size of the nanoparticles 22 and the formulation of the mixture 72.

Figure 9C:
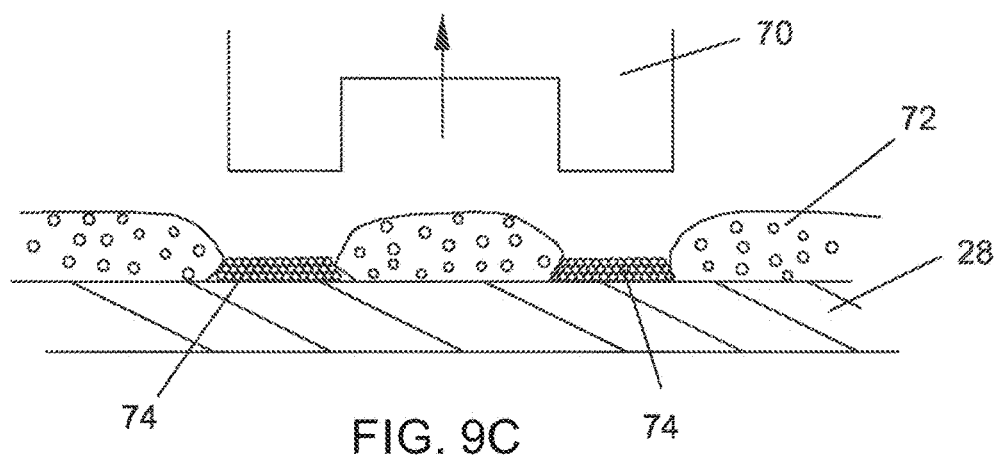

FIG. 9C depicts the process after the form 70 has been removed, leaving behind a fused pattern of metal 74 that corresponds to the pattern of the raised portions 76 of form 70. The portion of the mixture 72 that was not compressed has not fused and is removed by a process such as aqueous washing (not shown).

Figure 9D:
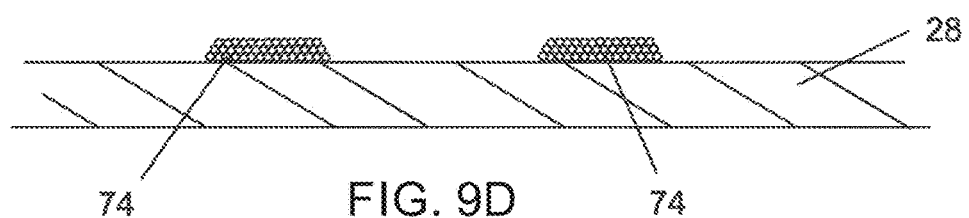

FIG. 9D depicts the finished pattern of metal 74 adhered to substrate 28. In certain embodiments, additional components (not shown) are attached to the substrate 28 and in electrical contact with portions of the circuit element formed by the pattern of metal 74. In certain embodiments, the circuit element created by the pattern of metal 74 is removed from the substrate 28 and transferred to a different support structure (not shown).

Figure 10:
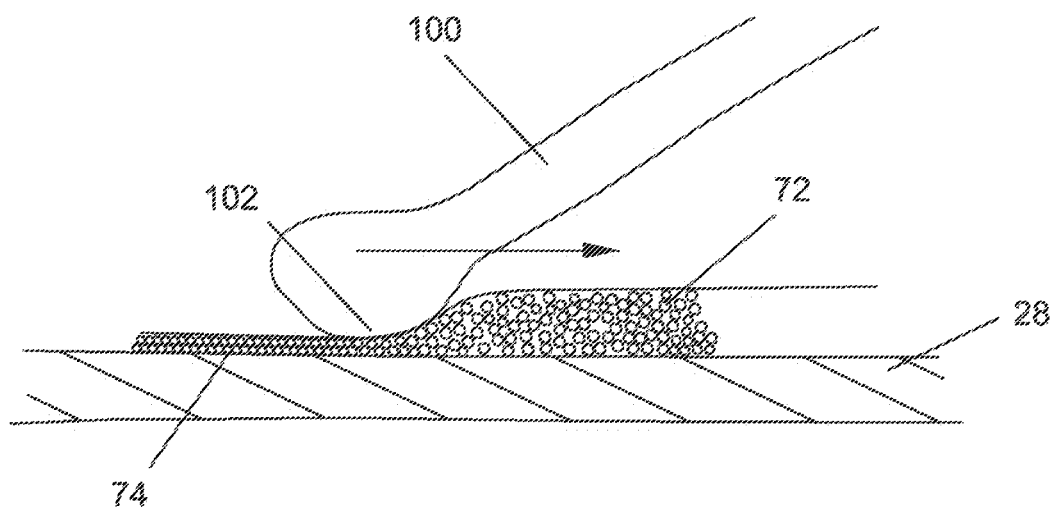
FIG. 10 depicts a method of fusing nanoparticles by nanoinscribing according to certain aspects of the present disclosure.

FIG. 10 depicts a method of fusing nanoparticles by nanoinscribing according to certain aspects of the present disclosure. Nanoinscribing is the process of tracing the shape of a circuit element with a mechanical element 100 over a layer of mixture 72 containing copper-containing nanoparticles. As previously stated, copper nanoparticles 22 having a diameter in the range of 20 nanometers, preferably less than 10 nanometers, more preferably in the range 1-7 nanometers, and even more preferably in the range 3-5 nanometers, can be fused by relatively low pressures, for example down to 90 psi, at ambient temperatures and without causing an increase in the temperature of the substrate 28. The mechanical element 100 compresses the mixture 72 with sufficient pressure under the tip 102 to fuse the copper nanoparticles 22 in the mixture 72 into a layer of metal 74. This mechanical element 100, in certain embodiments, has a tip 102 having a diameter on the order of micrometers.

Figure 11:
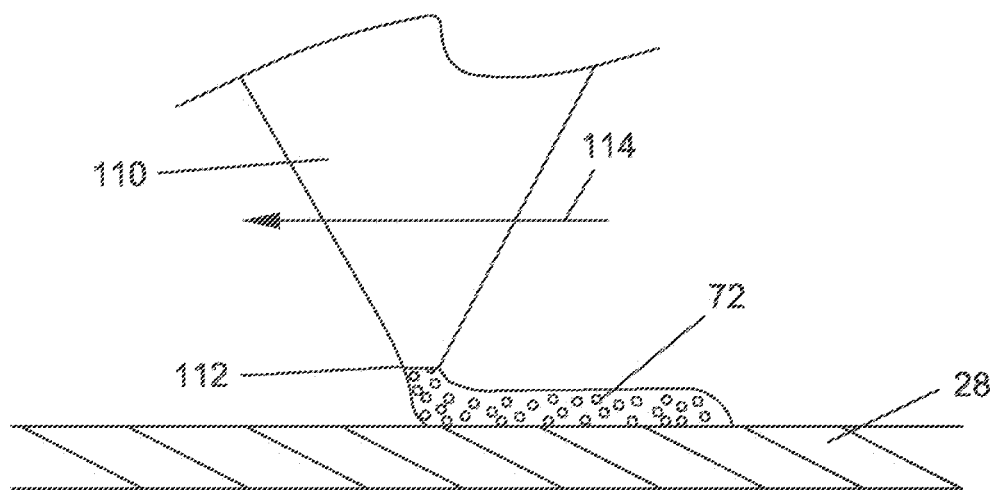
FIG. 11 depicts a method of applying a patterned layer of a mixture comprising copper nanoparticles according to certain aspects of the present disclosure.
Figure 12A:
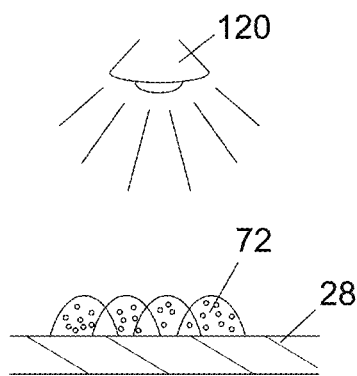
FIGS. 12A-12D depict methods of fusing a patterned layer of a mixture comprising copper nanoparticles according to certain aspects of the present disclosure.

FIG. 11 depicts a method of applying a patterned layer of a mixture 72 comprising copper nanoparticles 22 according to certain aspects of the present disclosure. In this embodiment, the mixture 72 is applied only where it is intended to create a circuit element by fusing the copper nanoparticles 22. The mixture 72 is applied in a pattern such as simple lines to form conductors or shapes such as the devices of FIGS. 4 and 5 can be created. The embodiment of FIG. 11 depicts the mixture 72 being extruded from the nozzle 112 of a reservoir 110 that is moving over a substrate 28, as indicated by the arrow 114 that indicates the direction of motion of the reservoir 110. The diameter of nozzle 112 controls the width and thickness of the pattern of mixture 72. After the entire pattern of mixture 72 has been formed on the substrate, the entire pattern of mixture 72 is cured by a process such as shown in FIG. 12A. In certain embodiments, the pressure created by the extrusion process induces at least partial fusion of the nanoparticles 22.

Figure 12B:
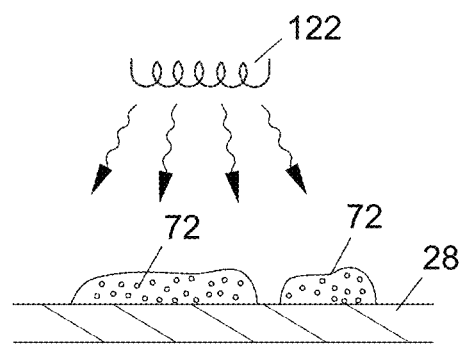
Figure 12C:
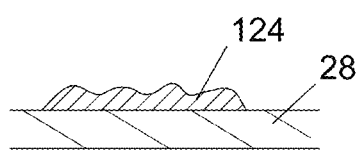

FIGS. 12A-12D depict methods of fusing a patterned layer of a mixture 72 comprising copper nanoparticles 22 according to certain aspects of the present disclosure. FIG. 12A depicts a patterned layer of mixture 72 that has been formed on a substrate 28 being exposed to a light source 120 that illuminates an area of the patterned mixture 72 with sufficient energy that the copper nanoparticles 22 fuse together. In certain embodiments, the light source 120 is energized for less than a second at a first power level. In certain embodiments, the light source 120 is energized for more than one second at second power level that is lower than the first power level. In certain embodiments, the energy delivered by the light source 120 is sufficient to fuse the copper nanoparticles 22 while raising the temperature of the substrate 28 to a temperature of less than 70° C. In certain embodiments, the energy delivered by the light source 120 is sufficient to fuse the copper nanoparticles 22 while raising the temperature of the substrate 28 less than 20° C. In certain embodiments, the radiation emitted from the light source 120 has a defined frequency band. In certain embodiments, the frequency band of the radiation emitted from the light source 120 covers at least a portion of the adsorption band of the nanoparticles 22. FIG. 12C depicts the substrate 28 and fused metal layer 124 that remain after the light source 120 has been turned off and any carrier material or unfused portions of the mixture 72 have been removed by a process such as aqueous washing (not shown).

In certain embodiments, the previously described laser 64 can be used to trace over a pattern of mixture, fusing the nanoparticles 22. Similarly, the nanoinscriber 100 can be used to trace a pattern of mixture to fuse the nanoparticles.

Figure 12D:
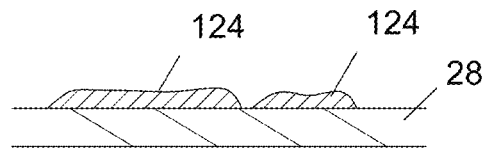

FIG. 12B depicts a patterned layer of mixture 72 that has been formed on a substrate 28 being exposed to a heat source 122 that heats the patterned mixture 72 with sufficient energy that the copper nanoparticles 22 fuse together. In certain embodiments, the heat source 122 is a radiant energy source. In certain embodiments, the heat source 122 generates heat that is convectively conveyed to the substrate 28. In certain embodiments, the energy delivered by the heat source 120 is sufficient to fuse the copper nanoparticles 22 while raising the temperature of the substrate 28 to a temperature of less than 70° C. In certain embodiments, the energy delivered by the heat source 122 is sufficient to fuse the copper nanoparticles 22 while raising the temperature of the substrate 28 less than 20° C. In certain embodiments, the energy delivered by the heat source 120 is sufficient to fuse the copper nanoparticles while raising the temperature of the substrate to a temperature of less than 70° C. FIG. 12D depicts the substrate 28 and fused metal layer 124 that remain after the substrate 28 has been removed from the heat created by heat source 122 and any carrier material or unfused portions of the mixture 72 have been removed by a process such as aqueous washing (not shown).

Another method of fusing the nanoparticles 22 shown in FIG. 12A or 12B is the use of existing vapor-phase reflow process equipment (not shown). As the vapor-phase process liquid is more effective in transferring thermal energy than the air in a convection oven, the temperature of the vapor can be limited to a lower temperature than the air of a convection oven while still achieving adequate processing speed. This lower temperature, in conjunction with the lower temperatures required to fuse the nanoparticles 22, may enable fabrication using materials or components that are not suitable for higher-temperature processes.

Figure 13:
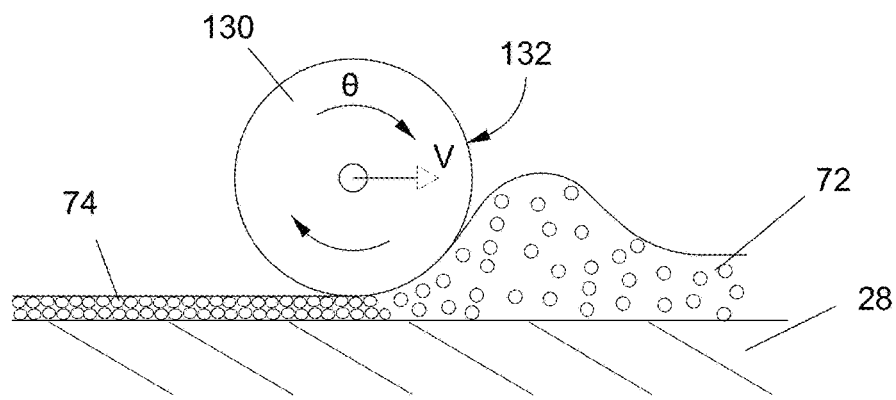
FIG. 13 depicts a method of fusing a layer of a mixture comprising copper nanoparticles by using a roller according to certain aspects of the present disclosure.

FIG. 13 depicts a method of fusing a layer of a mixture 72 comprising copper nanoparticles by using a roller 130 according to certain aspects of the present disclosure. In the embodiment of FIG. 13, the roller 130 is moved over the substrate 28 at a velocity V, compressing the mixture 72 to form a fused pattern of metal 74. In certain embodiments, the roller 132 is rotating at an angular velocity theta (A) such that the roller surface 132 has a non-zero velocity with respect to the substrate 28. In certain embodiments, the roller surface 132 comprises a textured surface (not shown). In certain embodiments, the roller surface 132 comprises parallel grooves (not shown). In certain embodiments, the roller 130 may be replaced by a ball (not shown) that may rotate with respect to the substrate 28 or move over the substrate 28 without rotation.

Figure 14A:
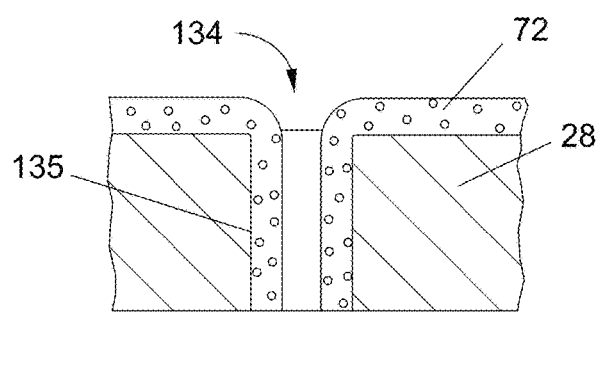
FIGS. 14A-14C depict methods of fusing a layer of a mixture comprising copper nanoparticles in a passage according to certain aspects of the present disclosure.
Figure 14B:
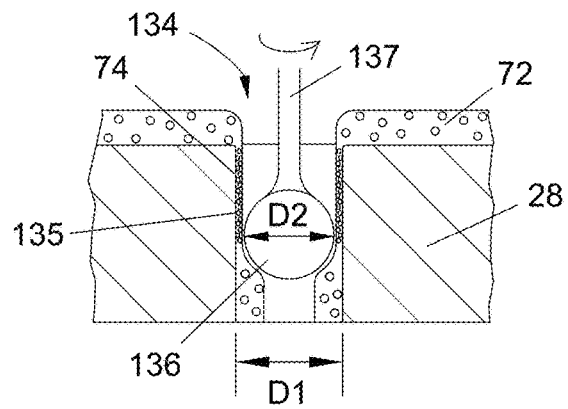
Figure 14C:
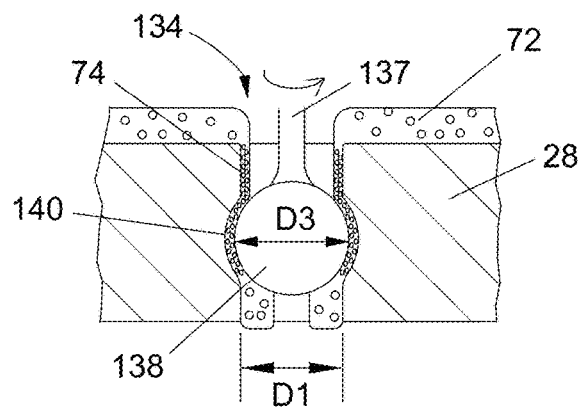

FIGS. 14A-14C depict methods of fusing a layer of a mixture 72 comprising copper nanoparticles in a passage 134 according to certain aspects of the present disclosure. In certain embodiments, the passage 134 is a via and the substrate 28 is a PCB. In FIG. 14A, a layer of mixture 72 has been formed on an inner surface 135 of the passage 134. In certain embodiments, mixture 72 fills the passage 134. In certain embodiments, mixture 72 fills only a portion of the length of the passage 134.

FIG. 14B depicts a ball 136 being passed through the passage 134, compressing the mixture 72 to form a fused pattern of metal 74 on the inner surface 135. In certain embodiments, the passage 134 is cylindrical with an inner diameter D1. In the embodiment of FIG. 14B, the ball 136 has a diameter D2 that is less than the passage diameter D1. In certain embodiments, the ball 136 is coupled to a shaft 137. In certain embodiments, the shaft 137 and ball 136 rotate with respect to the substrate 28 as the ball 136 passes through the passage 134. In certain embodiments, the ball 136 is replaced with a cylindrical element (not shown) that may have a rounded, shaped, or pointed lower tip. In certain embodiments, the ball 138 is replaced with an axially symmetric shaped element (not shown).

FIG. 14C depicts a ball 138 being passed through the passage 134, similar to FIG. 14B, compressing mixture 72 to form a fused pattern of metal 74. Ball 138 has a diameter D3 that is greater than or equal to the passage diameter D1. As ball 138 passes through passage 134, the substrate 28 is deformed in the region 140 adjacent to the ball 138. In certain embodiments, the deformation in region 140 is elastic and substrate 28 returns to its original shape after ball 138 has passed. In certain embodiments, substrate 28 does not fully return to its original shape. In certain embodiments, ball 137 is coupled to a shaft 137. In certain embodiments, the shaft 137 and ball 138 rotate with respect to the substrate 28 as the ball 138 passes through the passage 134. In certain embodiments, the ball 138 is replaced with a cylindrical element (not shown) that may have a rounded, shaped, or pointed lower tip. In certain embodiments, the ball 138 is replaced with an axially symmetric shaped element (not shown).

Burnishing the fused pattern of metal 74 may provide one or more benefits including reduction of fatigue failure, prevention of corrosion or stress corrosion, texturing the surface of the fused pattern of metal 74 to eliminate visual defects, reduction of porosity of the fused pattern of metal 74, and creation of residual compressive stress in the fused pattern of metal 74.

Burnishing by any of ball 136 or 138, roller 130, nanoscribing mechanical element 100, or other contact element may be accomplished at a pressure that the substrate 28 is elastically deformed in the contact area, returning to the original shape after the contact element moves away. In certain embodiments, the pressure applied by the contact element does not cause measurable deformation of the substrate 28.

In certain embodiments, burnishing is performed while the substrate 28 and fused pattern of metal 74 are at a temperature above ambient. In certain embodiments, burnishing is performed with the substrate 28 and the fused pattern of metal 74 are approximately at ambient temperature. In certain embodiments, the pressure applied by the contact element creates heat in the contact area of the fused pattern of metal 74. In certain embodiments, the relative motion of the contact element relative to the substrate creates friction and therefore heat in the contact area of the fused pattern of metal 74.

FIGS. 15A-15B depict another method of printing a circuit element according to certain aspects of the present disclosure. FIG. 15A depicts a drop 150 of a first mixture that comprises nanoparticles 152 that comprise copper with at least a partial coating of a surfactant (not visible in FIGS. 15A and 15B) ejected by a printer (not shown in FIG. 15A or 15B) similar to that of FIG. 2. In certain embodiments, the mixture comprises a carrier. In certain embodiments, the carrier is a liquid. In certain embodiments, the nanoparticles 152 are less than 50 nanometers in diameter. In certain embodiments, the nanoparticles are less than 20 nanometers in diameter. In certain embodiments, the nanoparticles are less than 10 nanometers in diameter. In certain embodiments, the nanoparticles are in the range of 1-7 nanometers in diameter. In certain embodiments, the nanoparticles are in the range of 3-5 nanometers in diameter. The drops 150 strike a substrate 28 and form a layer 154 of unfused nanoparticles 152.

FIG. 15B shows a drop 160 of a second mixture that comprises a dispersant that is configured to displace the surfactants of the nanoparticles 152. The combination of the chemical action of the dispersant and the kinetic energy provided by the moving drop 160 striking the layer 154 forces the unfused nanoparticles 152 in layer 154 into contact with each other with sufficient pressure to at least partially fuse the nanoparticles into a fused layer 156.

In summary, circuit elements that are created by fusing copper nanoparticles at temperatures below 70° C. and the method of forming the circuit elements are disclosed. Copper nanoparticles having diameters of less than 20 nanometers, and preferably less than 10 nanometers, and more preferably less than 4 nanometers, have properties that are not linear extensions of their bulk properties. Copper nanoparticles most preferably having a diameter of less than 4 nanometers are fused by the impact of drops of a mixture containing the copper nanoparticles that are sprayed onto a substrate. Copper nanoparticles having a diameter preferably less than 10 nanometers are fused by compression or heating to a temperature of less than 70° C. of a mixture containing the copper nanoparticles.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

The term "optical" covers electromagnetic radiation from ultraviolet to infrared, including wavelengths in the range of 10 nanometers to 1 millimeter and includes, but is not limited to, light visible to the human eye, which covers the range of 380-760 nanometers.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," "with" or the like is used in the description or the claims, such term is intended to be inclusive in a manner similar to the term "comprise" as "comprise" is interpreted when employed as a transitional word in a claim.

What is claimed is:

1. An ink adapted for forming conductive elements, the ink comprising:
   a plurality of nanoparticles comprising copper and having at least a partial coating of a surfactant thereon that is configured to separate adjacent nanoparticles, the nanoparticles being fusable when deposited at a sufficient velocity in the presence of a dispersant configured to displace the coating of the surfactant when the nanoparticles have a kinetic energy while moving at the sufficient velocity; and
   a carrier that comprises the dispersant.

2. The ink of claim 1, wherein the nanoparticles are configured to fuse to one another when one nanoparticle strikes another nanoparticle with a relative velocity greater than 0.5 meters per second.

3. The ink of claim 2, wherein the nanoparticles are configured to fuse to one another when one nanoparticle strikes another nanoparticle with a relative velocity greater than 1.0 meters per second.

4. The ink of claim 1, wherein the nanoparticles are configured to fuse to one another when one nanoparticle is pressed against another nanoparticle with an interparticle pressure, considered as an interparticle force divided by a nominal cross-sectional area of a nanoparticle, that is less than 600 kilopascals (kPa).

5. The ink of claim 4, wherein the nanoparticles are configured to fuse to one another when the interparticle pressure is less than 5000 kilopascals (kPa).

6. The ink of claim 5, wherein the nanoparticles are configured to fuse to one another when the interparticle pressure is less than 14000 kilopascals (kPa).

7. A method of creating a conductive element on a substrate, the method comprising:
   spraying a plurality of drops of a mixture comprising nanoparticles that comprise copper, have a diameter of less than 20 nanometers, and have at least a partial coating of a surfactant thereon toward a substrate at a velocity greater than 0.5 meters per second, the surfactant being removed when the nanoparticles are deposited at the velocity, such that the nanoparticles at least partially fuse with each other upon impact with the substrate and form a fused layer,
   wherein the mixture comprises a dispersant configured to displace the coating of the surfactant when the nanoparticles have a kinetic energy while moving at the velocity.

8. The method of claim 7, wherein the nanoparticles have a diameter of less than 10 nanometers.

9. The method of claim 8, wherein the nanoparticles have a diameter in the range of 1-7 nanometers.

10. The method of claim 9, wherein the nanoparticles have a diameter in the range of 3-5 nanometers.

11. The method of claim 7, wherein a temperature of the substrate remains within 20° C. of ambient temperature while the nanoparticles are fusing to each other.

12. The method of claim 7, wherein a temperature of the substrate remains below 200° C. while the nanoparticles are fusing to each other.

13. The method of claim 12, wherein the temperature of the substrate remains below 70° C. while the nanoparticles are fusing to each other.

14. The method of claim 7, wherein the substrate is flexible.

15. The method of claim 7, further comprising:
   applying a coating of a protective material over the fused layer.

16. The method of claim 7, wherein the drops are sprayed with a velocity that is greater than 1.0 meters per second.

17. The method of claim 16, wherein the drops are sprayed with a velocity that is greater than 10 meters per second.

* * * * *